(12) United States Patent
Lee

(10) Patent No.: US 7,836,704 B2
(45) Date of Patent: Nov. 23, 2010

(54) COMPACT THERMAL EXCHANGE UNIT OF THERMO-ELECTRIC COOLING MODE USING HEAT PIPE

(76) Inventor: Dong Gyu Lee, Jugong Apt. 502-901, Yeongtong-dong, Yeongtong-gu, Suwon-si, Gyeonggi-do 443-727 (KR)

( * ) Notice: Subject to any disclaimer, the term of this patent is extended or adjusted under 35 U.S.C. 154(b) by 364 days.

(21) Appl. No.: 10/570,114

(22) PCT Filed: Sep. 24, 2004

(86) PCT No.: PCT/KR2004/002476
§ 371 (c)(1),
(2), (4) Date: Nov. 6, 2006

(87) PCT Pub. No.: WO2005/031992
PCT Pub. Date: Apr. 7, 2005

(65) Prior Publication Data
US 2007/0039332 A1    Feb. 22, 2007

(30) Foreign Application Priority Data
Oct. 1, 2003    (KR) .................. 10-2003-0068390

(51) Int. Cl.
*F25B 21/02*    (2006.01)
(52) U.S. Cl. ............................. 62/3.2; 62/3.6
(58) Field of Classification Search .............. 62/3.2, 62/3.7
See application file for complete search history.

(56) References Cited

U.S. PATENT DOCUMENTS

| | | | |
|---|---|---|---|
| 5,315,830 A * | 5/1994 | Doke et al. ................. 62/3.2 |
| 5,621,614 A * | 4/1997 | O'Neill ...................... 361/698 |
| 5,986,882 A | 11/1999 | Ekrot et al. |
| 6,038,128 A * | 3/2000 | Hood et al. ............. 361/679.41 |
| 6,122,169 A | 9/2000 | Liu et al. |
| 6,233,944 B1 * | 5/2001 | Yamada et al. ................ 62/3.7 |
| 6,356,445 B1 | 3/2002 | Mochzuki et al. |
| 6,415,612 B1 * | 7/2002 | Pokharna et al. .............. 62/3.2 |
| 6,474,074 B2 * | 11/2002 | Ghoshal ....................... 62/3.7 |
| 6,474,407 B1 * | 11/2002 | Chang et al. ............... 165/80.3 |
| 6,654,243 B2 | 11/2003 | Sheu |
| 6,654,245 B2 | 11/2003 | Kawashima et al. |
| 2002/0038550 A1 * | 4/2002 | Gillen .......................... 62/3.7 |

OTHER PUBLICATIONS

International Search Report for International Application No. PCT/KR2004/002476.

* cited by examiner

*Primary Examiner*—Cheryl J Tyler
*Assistant Examiner*—Lakiya Rogers
(74) *Attorney, Agent, or Firm*—McDonnell Boehnen Hulbert & Berghoff LLP

(57) ABSTRACT

The present invention relates to a thermal exchange device using heat pipes to effectively discharge heat from inside of an open-air communication system. The present invention provides a plurality of heat pipes directly inserted between the plates of the thermo-electric cooling unit for accommodating a plurality of fins thereon. According to the structure suggested by the invention, since the heat pipes can be placed laterally with the thermo-electric cooling unit, the size of the overall communication system can be reduced with the same discharge capability.

9 Claims, 2 Drawing Sheets

[Fig. 1]
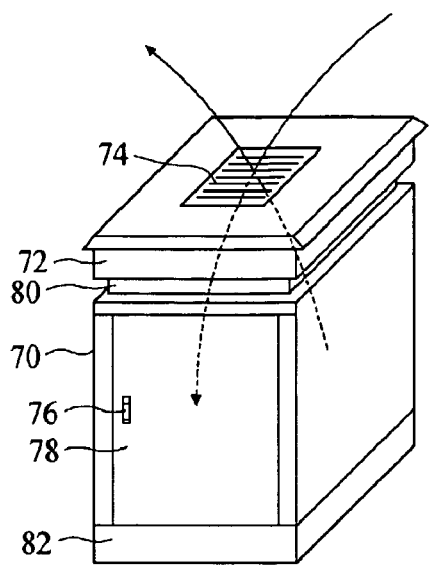
[Fig. 2]
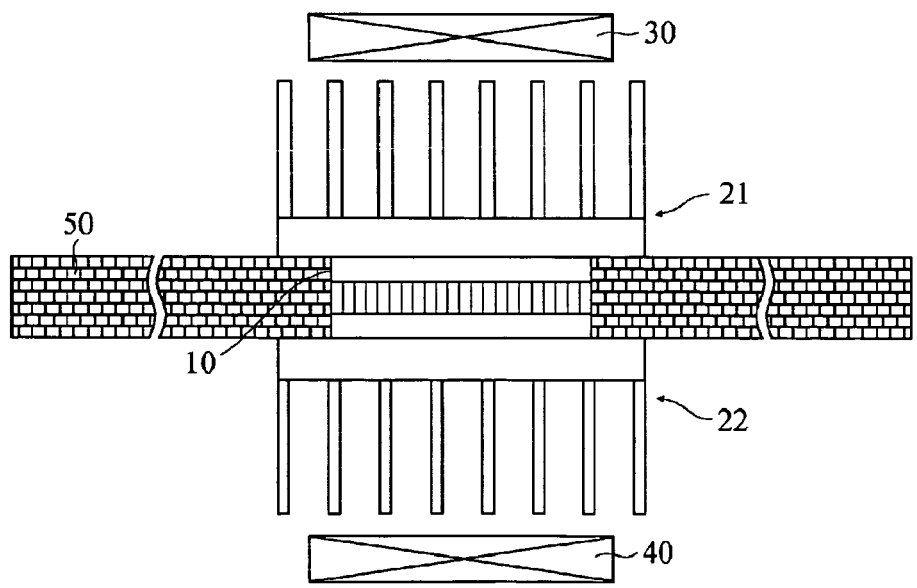
[Fig. 3]
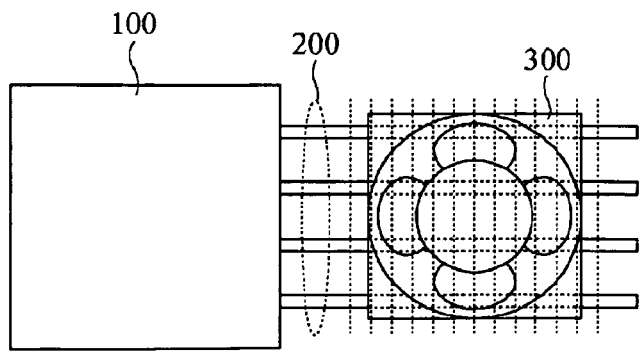

[Fig. 4]
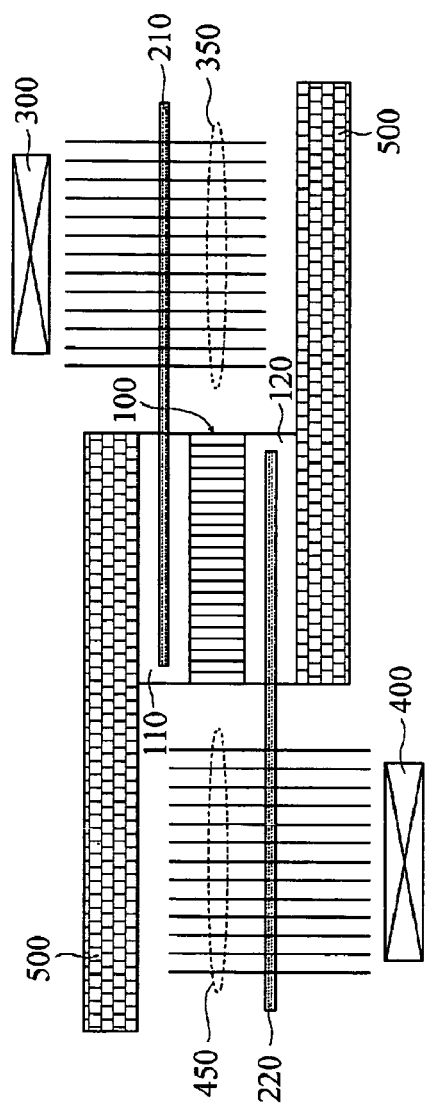
[Fig. 5]
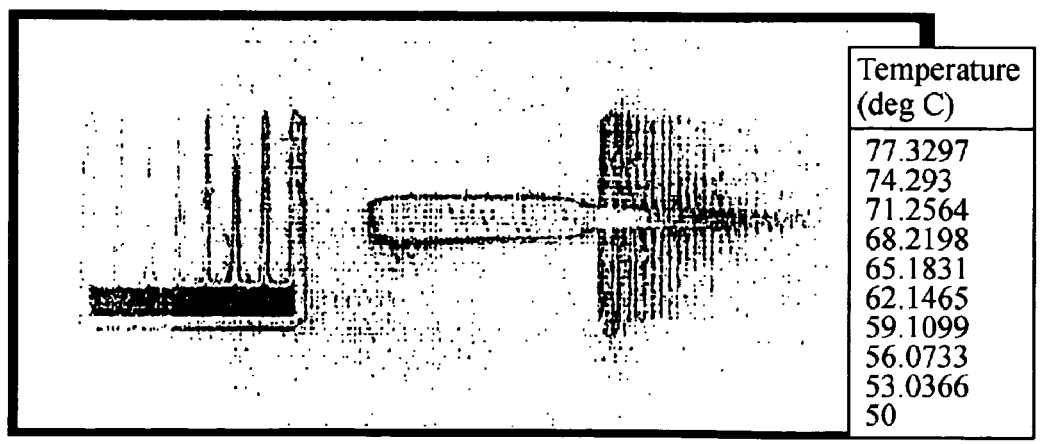

COMPACT THERMAL EXCHANGE UNIT OF THERMO-ELECTRIC COOLING MODE USING HEAT PIPE

TECHNICAL FIELD

The present invention relates to a thermal exchange device using heat pipes to effectively discharge heat from inside of an open-air communication system.

BACKGROUND ART

In a conventional thermal exchange device, a heat sink, which has a plurality of fins and is attached to the top and bottom plates of a thermo-electric cooling unit, has been widely used. In order to obtain a sufficient capability for discharging heat from inside of the communication system, the height and pitch of the fins at the heat sink rust increase in size. This results in the lager size of the overall communication system.

In general, electronic devices or communication devices radiate heat by using a radiation equipment. If they do not radiate the heat, then the devices will become out of order due to the breakdown or shortage caused by the heat.

An open-air communication system (e.g., a base station, a subscriber network and a traffic controller) adopts the method of radiating internal heat to the outside by using a specific radiation device or cooling a mainframe located inside by inspiriting air from outside.

Moreover, a conventional optical repeater could use a heat sink for radiation since its communication is performed through lower frequencies because of low data amount. However, since the frequency bands are enlarged into the super high frequencies due to the augmentation of the traffic and the communication devices become highly integrated, leaner and lighter, the conventional heat sink could no longer effectively perform the radiation. Therefore, the forced cooling methods of attaching fan to a body are suggested to solve the above problem.

Now, referring to FIG. 1, the conventional open-air housing is described.

FIG. 1 is a perspective view of an exemplary open-air housing.

An open-air base station comprises: an inside system which provides the actual services; an external housing (70) for insulating and protecting the inside system from the outside; a heat exchanger (72) located about the upper side of the housing (70) to maintain internal temperature of the system within a predetermined range; a vent (74) located about the upper side (72) of the heat exchanger for changing air.

In addition, a door is formed on a lateral side of the housing. The door includes a handle for facilitating the maintenance of the system and can be used to open and close the door. The D-Gasket (80) for waterproof and rainproof is formed between the heat exchanger (72) and the housing (70). The Plinth (82) for laying a cable (not shown) of the system is formed about the lower side of the housing (70).

The above system operates as follows.

First, the temperature sensor (not shown) in the housing (70) senses the temperature. If the sensed temperature is over the predetermined temperature, then the temperature of the inside system can be maintained constantly by operating an internal air discharging fan and/or an external air inspiration fan (not shown) and exchanging the heat with heat plates (not shown) of the heat exchanger (72).

FIG. 2 describes the structure of the thermo-electric cooling heat exchanger.

It consists of the thermo-electric cooling elements (10; TEC) which includes: a hot-side insulator; a cool-side insulator and semiconductor grids plated with a conductive material onto both sides and performs heat exchange; the heat sinks (21, 22) for radiating heat due to the heat generation of the system; an external fan (30) which inspires an outside air from the supply vent, passes it through the TEC (10) and discharges it to the discharging vent; and an internal fan which passes the inside air through the heat sinks (21, 22) and the TEC (10).

As described above, the conventional TEC has adopted the method of attaching the heat sinks to both plates of the TEC The heat sink is made by extruding. If its size is large, then it is made as a bonded type. If the height of a fin is over 100 mm, then the radiation area per unit volume becomes limited since a pitch should be over 10 mm and a thickness should be over 2 mm. Moreover, the thermal resistance from the base of the heat sink to the edge of a fin should be significantly considered.

That is, the TEC uses the extruding heat sink or the bonded type heat sink. If so, however, the height, thickness and pitch of a fin become limited. Therefore, the radiation area is limited and the radiation ability per unit volume becomes low.

DISCLOSURE OF INVENTION

Technical Problem

Instead of the conventional heat sink, the present invention provides a plurality of heat pipes that uses a high-density fin stack directly inserted between the plates of the thermo-electric cooling unit for accommodating a plurality of fins thereon. According to the structure suggested by the invention, since the heat pipes can be placed laterally with the thermo-electric cooling unit, the size of the overall communication system can be reduced with the sane discharge capability.

Technical Solution

To achieve this purpose, the present invention includes: a thermal electric cooling unit (100) formed around the center of the compact thermal exchange device; two plates (110, 120) in the thermal electric cooling unit, each of the plates being formed on an upper side and a lower side of the unit, respectively; two housing walls (500), each of the housing walls being installed on the upper side and the lower side of the thermal electric cooling unit, respectively; a plurality of heat pipes (210, 220 directly inserted into the center of the plates; a plurality of fins formed on both sides of the heat pipes (350, 450); an external fan (300) provided over the fins which processes an outside air; and an internal fan (400) under the fins which processes an inside air.

ADVANTAGEOUS EFFECTS

The present invention enhances the radiation ability per unit volume by applying high-density fin stack to the thermo-electric cooling technology which has the Peltier Effect and effectively radiates the inside heat generated from the housing of the open-air communication device.

In addition, since the radiation ability per unit volume is enhanced, the size of the heat exchanger and the housing can be reduced. The heat pipes can be freely allocated free, wherein the space around the heat exchanger can be used more efficiently. While the conventional arts use a high capacity TEC device in case the heat sink cannot be enlarged, the present invention does not need to use the high capacity TEC device and economizes electric power since the radiation ability of the fin stack is excellent.

BRIEF DESCRIPTION OF THE DRAWINGS

The above object and features of the present invention will become more apparent from the following description of the preferred embodiments provided in conjunction with the accompanying drawings.

FIG. 1 shows a perspective view of an exemplary open-air housing.

FIG. 2 shows a view of the structure of the conventional TEC heat exchanger.

FIGS. 3 and 4 show the TEC heat exchanger of the present invention, to which heat pipes are applied.

FIG. 5 shows the results obtained from modeling the conventional TEC heat exchanger and the present invention for a thermal analysis.

BEST MODE FOR CARRYING OUT THE INVENTION

FIGS. 3 and 4 depict the structure of the present invention to which heat pipes are applied.

As shown therein, the plates (110, 120) formed in the center of the TEC heat exchanger, considering the thermal transmission area, are formed on an upper side and a lower side of the unit. The housing wall (500) is formed on an upper side and a lower side of the plates.

A plurality of heat pipes (210, 220) are directly inserted into the center of each plate, wherein the heat pipes (210) are formed on the right and the heat pipes (220) are formed on the left. A thin high-density fin stack (350) is formed for the heat pipes (210) to be centered on the fin stack (350). Further, an external fan (300) for processing an outside air is formed on an upper side of the fin stack (350). A thin high-density fin stack (450) is formed for the heat pipes (220) to be centered on the fin stack (450). Also, an internal fan (400) for processing an inside air is formed on a lower side of the fin stack (450).

In case one end of the pipe is heated, heat energy is transmitted to the other end by evaporation of liquid. The other end of the pipe radiates the heat and the liquid comes back in situ through the pipe. The heat can be effectively transmitted by the above structure.

Generally, an open-air communication device should be sheltered from outside to protect the inside of the housing from high/low temperature, humidity, etc. Therefore, the heat exchanger is essential to prevent the housing from rising temperature caused by the inside generation of heat. The heat exchanger can be typically used in the range of −30° C.~50° C., and the assemblies which are embedded in the inside of the device can be used in the range of 0° C.~60° C. Therefore, the performance of the heat exchanger satisfies ΔT10° C.

If the inside temperature of the device is maintained by the outside temperature (e.g., the outside temperature is extremely high or some assemblies are vulnerable to high temperature), a plate type heat exchanger or a heat pipe heat exchanger cannot be available. Therefore, the TEC heat exchanger or an air conditioner is used for cooling.

However, while the performance of the air conditioner is satisfactory, a constant maintenance (e.g., supplying refrigerant) is necessary because the refrigerant can leak. On the other hand, the TEC heat exchanger does not need to be maintained, is semi-permanent, is further noiseless and stable since it does not have mechanical assemblies, with the exception of a fan.

As shown in FIG. 2, the conventional TEC heat exchanger adopts the method of attaching heat sinks to both plates. The heat sink is made by extruding, and if its size is large, it is made as a bonded type. If the height of a fin is over 100 mm, the radiation area per unit volume becomes limited since a pitch should be over 10 mm and a thickness should be over 2 mm. Moreover, the thermal resistance from the base of the heat sink to the edge of a fin should be considered.

To solve the above problem, the present invention eliminates the heat sink, inserts the heat pipes into the plates of the TEC heat exchanger, and stacks thin fins to the heat pipes. In case the fins are stacked to the heat pipes, the fins can be made under the thickness of 0.1 mm and the pitch of 2 mm. Therefore, the radiation area per unit volume becomes larger than the conventional device and the radiation capacity is significantly enhanced.

FIG. 5 shows the results obtained by modeling the conventional TEC heat exchanger and the present invention for a thermal analysis. Flotherm is used as a program for the thermal analysis, and the temperature of the cooling air that is introduced through the use of a fan is 50° C. As shown in FIG. 5, as a result of the thermal analysis, the temperature of the center of the base in the heat sink type is 77° C. and the temperature of the center of the base in the heat pipe type is 71.7° C. The thermal difference ΔT from an outside air is decreased from 27.0° C. to 21.1° C.

Therefore, it can be understood that the performance of the present invention is clearly better than the conventional device. As described above, the particular example of the TEC heat exchanger, which uses the heat pipe, is explained herein. However, the present invention can be modified within the limitation not to depart from the range of the present invention. Therefore, the range of the present invention should not be limited within the described examples and be determined by the claims and the equivalences of the claims.

The invention claimed is:

1. A thermal exchange device comprising:
    a planar thermal electric cooling unit having an upper planar side and a lower planar side, comprising a first planar plate positioned on the upper planar side and a second planar plate positioned on the lower planar side of the unit;
    a housing comprising a first housing wall and a second housing wall, wherein the first housing wall is positioned on the first planar plate of the thermal electric cooling unit and the second housing wall is positioned on the second planar plate of the thermal electric cooling unit;
    a first heat pipe positioned within the first planar plate, wherein a predetermined portion of the first heat pipe extends laterally beyond the first planar plate in a first direction;
    a second heat pipe positioned within the second planar plate, wherein a predetermined portion of the second heat pipe extends laterally beyond the second planar plate in a direction opposite to the first direction;
    a plurality of fins formed on the predetermined portion of each of the heat pipes;
    an external fan provided over the fins on the first heat pipe that draws air outside the housing into the housing; and an internal fan provided under the fins on the second heat pipe that circulates air within the housing.

2. The thermal exchange device of claim 1, wherein of the first heat pipe is positioned in a center of the first planar plate, and the second heat pipe is positioned in a center of the second planar plate.

3. A thermal exchange device comprising:

a thermal electric cooling unit comprising a first planar plate and a second planar plate, wherein the first planar plate is in a first plane, and the second planar plate is in a second plane which is below the first plane;

a first housing wall positioned above the first planar plate;

a second housing wall positioned below the second planar plate;

a first heat pipe positioned within the first planar plate and extending laterally in a first direction;

a second heat pipe positioned within the second plate and extending laterally in a second direction opposite the first direction;

a first plurality of fins formed on the first heat pipe, the first plurality of fins extending radially from the first heat pipe; and a second plurality of fins formed on the second heat pipe, the second plurality of fins extending radially from the second heat pipe.

4. The thermal exchange device of claim 3, further comprising an external fan formed on an upper side of the first plurality of fins.

5. The thermal exchange device of claim 4, wherein the external fan processes an outside air.

6. The thermal exchange device of claim 5, further comprising an internal fan formed on a lower side of the second plurality of fins.

7. The thermal exchange device of claim 6, wherein the internal fan processes the air within the first housing wall and the second housing wall.

8. The thermal exchange device of claim 3, wherein the first plurality of fins is a high-density fin stack.

9. The thermal exchange device of claim 3, wherein the second plurality of fins is a high-density fin stack.

* * * * *